United States Patent [19]
Nishida et al.

[11] Patent Number: 6,144,515
[45] Date of Patent: Nov. 7, 2000

[54] EQUALIZER HAVING A PROCESSING UNIT FOR SELECTING A COEFFICIENT OUT OF A COEFFICIENT TABLE

[75] Inventors: Yasutaka Nishida, Kokubunji; Seiichi Mita, Shiroyamamachi; Naoki Satoh, Odawara; Yoshiju Watanabe, Niromiyamachi, all of Japan

[73] Assignee: Hitachi, Ltd., Tokyo, Japan

[21] Appl. No.: 09/229,561

[22] Filed: Jan. 13, 1999

Related U.S. Application Data

[62] Division of application No. 08/756,648, Nov. 26, 1996, Pat. No. 5,970,091.

[30] Foreign Application Priority Data

Nov. 30, 1995 [JP] Japan ................................. 7-311947

[51] Int. Cl.[7] ...................................................... G11B 5/03
[52] U.S. Cl. ................................................ 360/66; 375/232
[58] Field of Search .................................. 360/65, 66, 32, 360/46; 375/232, 233, 231

[56] References Cited

U.S. PATENT DOCUMENTS

| | | | |
|---|---|---|---|
| 5,283,521 | 2/1994 | Ottesen et al. | 324/225 |
| 5,398,259 | 3/1995 | Tsujimoto | 375/233 |
| 5,400,189 | 3/1995 | Sato et al. | 360/65 |
| 5,414,571 | 5/1995 | Matsushige et al. | 360/65 |
| 5,418,660 | 5/1995 | Sato et al. | 360/65 |
| 5,543,978 | 8/1996 | Park | 360/65 |
| 5,654,765 | 8/1997 | Kim | 348/614 |
| 5,744,993 | 4/1998 | Sonntag | 360/65 X |

FOREIGN PATENT DOCUMENTS

| | | |
|---|---|---|
| 5-266403 | 10/1993 | Japan . |
| 6-44510 | 2/1994 | Japan . |

Primary Examiner—Andrew L. Sniezek
Attorney, Agent, or Firm—Mattingly, Stanger & Malur, P.C.

[57] ABSTRACT

The equalizer is capable of generating an equalized output that is compensated in the non-linearity of the signal reproduced by an MR head and a reliable high-density magnetically recorded-signal reproducer. The equalizer of an FIR-type filter structure includes a plurality of delay elements for delaying an input signal by a certain period, a plurality of coefficient processing units provided to input or output taps of the delay elements, and an adder for obtaining the sum of the outputs of the coefficient processing units. The distortion of the reproduced waveform can be corrected by a relatively simple circuit structure by comparing the signal value inputted to the coefficient processing unit from each tap with a predetermined threshold level and changing the signal value and a coefficient value to be multiplied in accordance with the comparison result. Therefore, any one of various existing signal processing systems can be applied to the decoding of reproduced signals of an MR head having the non-linear characteristic.

8 Claims, 9 Drawing Sheets

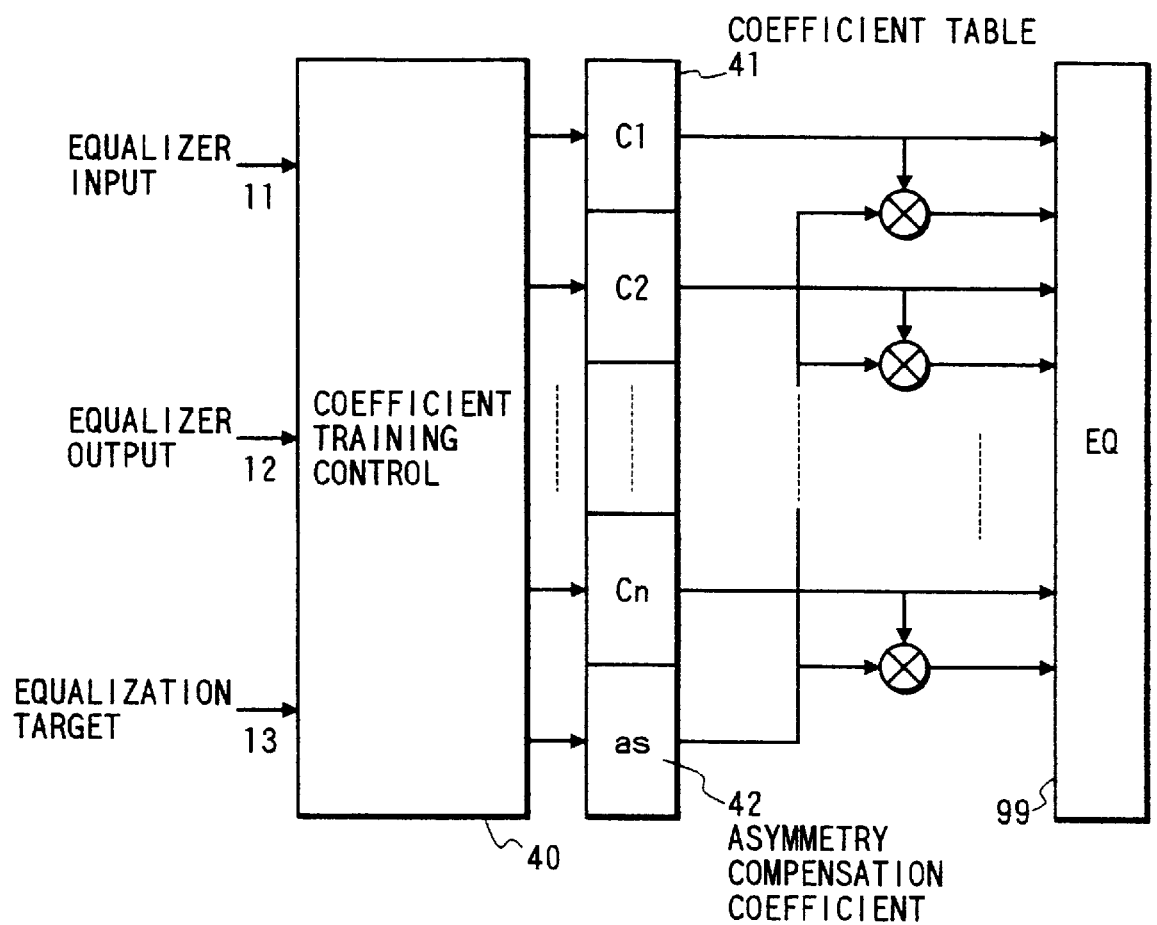
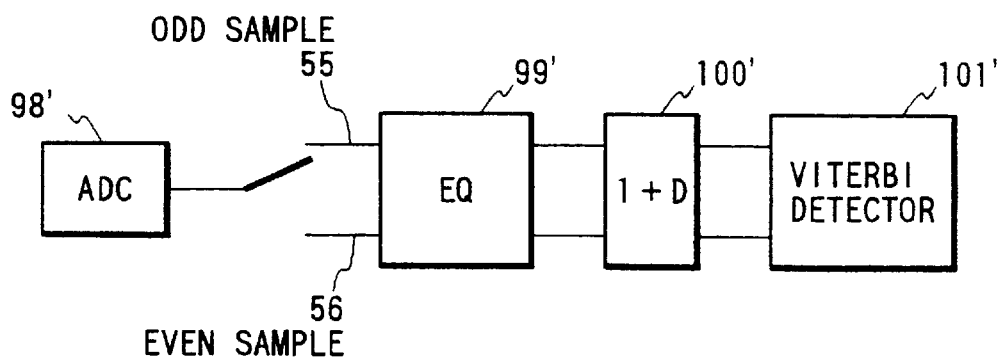

EQUALIZER HAVING A PROCESSING UNIT FOR SELECTING A COEFFICIENT OUT OF A COEFFICIENT TABLE

This is a divisional application of U.S. Ser. No. 08/756,648, filed Nov. 26, 1996, now U.S. Pat. No. 5,970,091.

BACKGROUND OF THE INVENTION

The present invention relates to an equalizer and a magnetically recorded-signal reproducer, more particularly to an equalizer suitable for the processing of a reproduced signal by an MR-type read head and a magnetically recorded-signal reproducer using the MR-type read head.

In a magnetic disk drive, the sensitivity of a read head has been improved to increase the density and a read head (hereafter referred to as MR head) using the magnetoresistance effect has been developed instead of conventional inductive heads.

The flux-to-reproduced voltage conversion characteristic of the MR head is shown by the curve 76 of FIG. 11. The operating area of the MR head 74 is set to the linear portion of the characteristic 76 by superposing a bias field 73 on an input field 71 sent from a magnetic recording medium with information recorded. In this case, non-linearity represented by amplitude asymmetry appears on the reproduced waveform 72 due to the deviation of the bias field or the variation of the magnetic characteristics. In general, the circuits of the signal processing system of a magnetic disk drive is designed assuming that a magnetically recorded-signal reproducing system including a write head and a read head is linear. Therefore, the non-linearity which appears in the operating area of the MR head causes the performance of the magnetic disk drive to greatly deteriorate.

In a conventional disk drive, the non-linearity of the MR head is linearly equalized by the FIR-type equalizer shown in FIG. 2.

The FIR-type equalizer comprises a plurality of delay elements 1 (1-1 to 1-n) multistage-connected to delay the input signal by one bit in time, a plurality of coefficient processing units (2'-0 to 2'-n) connected to the input signal tap at the first stage and the output signal tap at each stage, and an adder 10 for adding the outputs of the coefficient processing units. The coefficient processing unit 2'-i multiplies the tap output 11-i by a predetermined tap coefficient. When the input signal waveform of a tap output has a distortion, each coefficient processing unit performs a linear operation of the distorted signal and therefore, it is difficult to completely compensate the above non-linearity. Therefore, to prevent performance deterioration, an idea for correcting the non-linearity of a reproduced signal before the signal is input to an equalizer has been proposed.

In U.S. Pat. No. 5,418,660, for example, a system is proposed which corrects the amplitude asymmetry of the reproduced waveform supplied to an equalizer by setting an A-D conversion scale to a different value in accordance with the polarity (positive or negative) of the input signal in an A-D converter for supplying the input to the equalizer.

In Japanese Patent Laid-Open No. 44510/1994, a method is proposed according to which the amplitude value is corrected (converted) by converting the reproduced signal output from an MR head from analog to digital values and thereafter using a look-up table. In the above proposals, the conversion characteristic of the amplitude value to be set in the look-up table is obtained by measuring the characteristics of each MR head while previously changing the bias field of the MR head. When the characteristic of an MR head is changed, fitting is performed in accordance with the data stored in the table.

Moreover, in Japanese Patent Laid-Open No. 266403/1993, a method is proposed which reduces the deterioration due to non-linearity by optimizing the equalization target of an FIR filter.

Furthermore, there is an idea of improving non-linearity including non-linear transition shift by using an equalizer constituted by incorporating a RAM into a decision feedback equalizer.

However, according to the conventional system for correcting MR non-linearity before the input of an equalizer, complicated characteristic are necessary for a canceler in order to completely remove nonlinearity and therefore, a problem arises that the circuit is increased in size and the fabrication cost rises because the structure of the arithmetic circuit is complicated and the memory capacity is increased. Moreover, according to the conventional system, the circuit delay of an additional circuit provided in the reproduced signal path adversely affects the feed loop system for phase locked loop (PLL) and automatic gain control (AGC). Furthermore, according to a system of correcting MR non-linearity by an A-D converter, it is difficult to accurately fabricate an LSI because the applied voltages and loads of circuit elements constituting the A-D converter change when the reference voltage is changed to change the scaling. Moreover, to change the scaling by the reference voltage of the A-D converter, the correction coefficient becomes an analog value and thereby, accurate correction is difficult due to variations in circuit elements.

SUMMARY OF THE INVENTION

It is an object of the present invention to provide an equalizer capable of compensating the non-linearity of an MR head by a relatively simple circuit structure.

It is another object of the present invention to provide a magnetically recorded-signal reproducer capable of performing linear-signal-processing of the reproduced signal sent from a magnetic recording medium with information recorded at a high density.

To solve the above problems, an equalizer of the present invention comprises a plurality of delay elements multistage-connected so as to successively delay the input signals by a certain period, a plurality of coefficient processing units for multiplying the signals from the input or output taps of the delay elements by coefficient values and outputting them, and an adder for adding the signals output from the coefficient processing units so as to select coefficient values to be used for arithmetic operation in accordance with the signal inputs to the coefficient processing units. In the case of coefficient value selection performed by each coefficient processing unit, it is also possible to prepare, for example, two coefficient values and change them according to the polarity of the signal input to the coefficient processing unit.

A digital recorded-signal reproducer of the present invention comprises a read head using an MR element for reading the coded signals recorded on a recording medium, amplification means for amplifying the reproduced signals output from the read head, means for sampling signals output from the amplification means at a predetermined cycle, means for equalizing the signals output from the sampling means in accordance with a predetermined equalization rule, and means for discriminating recorded signals read by the read head in accordance with signals output from the equalization means, in which the equalization means is provided with means for correcting the signal distortion inherent to the read head and included in the signal output from the sampling means.

The correction means corrects the amplitude distortion which differs depending on the polarity of the signal output from sampling means.

BRIEF DESCRIPTION OF THE DRAWINGS

FIG. 6 is a block diagram showing the detail of a coefficient training control 15 of the embodiment of FIG. 4;

FIG. 7 is an illustration showing a third embodiment of an equalizer of the present invention;

DETAILED DESCRIPTION OF THE PREFERRED EMBODIMENT

Figure 3:
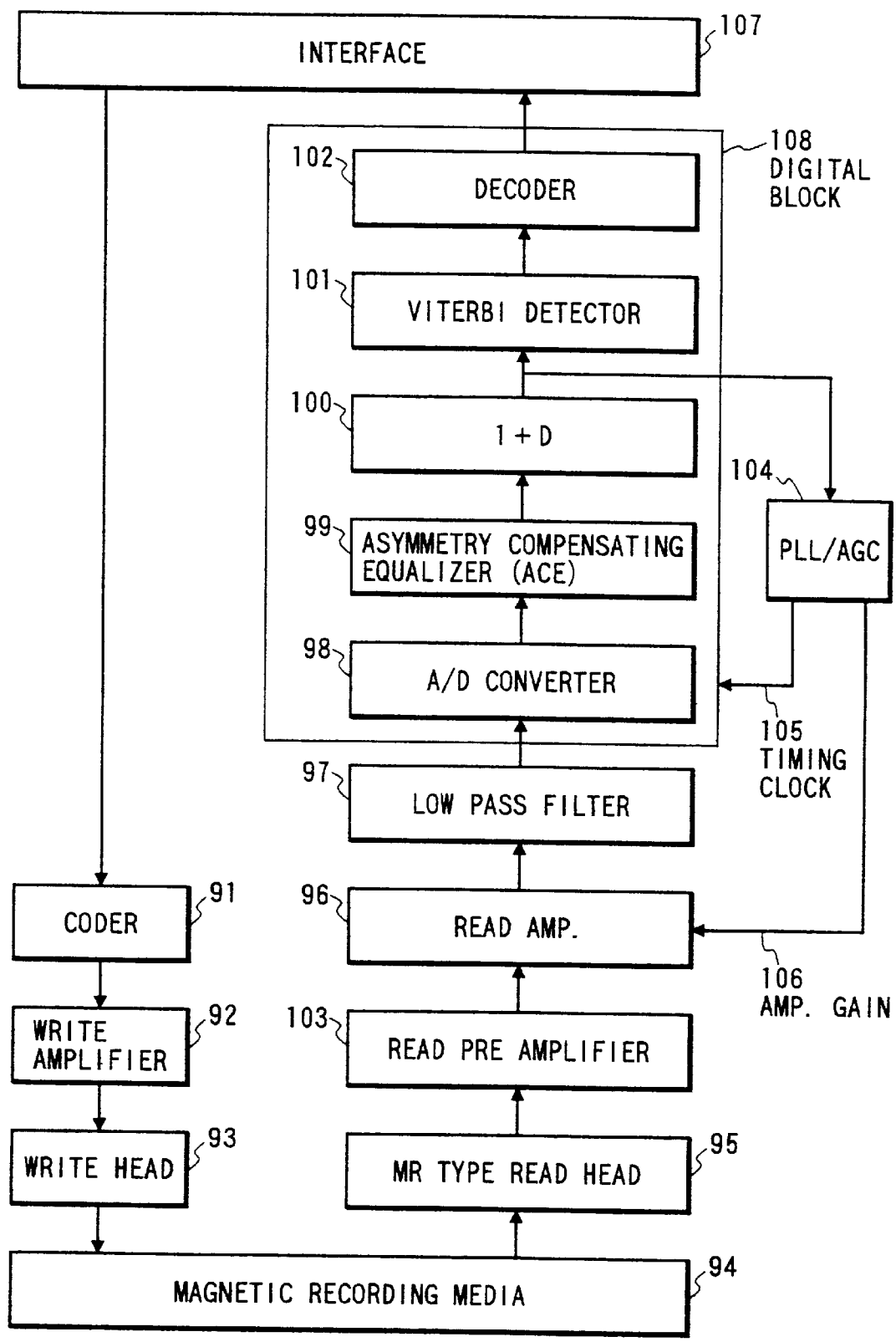
FIG. 3 is a block diagram showing a magnetically recorded-signal reproducer to which an equalizer of the present invention is applied.

FIG. 3 shows a block diagram of a high-density magnetically recorded-signal reproducer having a signal reproduction system according to a PRML (Partial Response Maximum Likelihood) method to which an equalizer of the present invention is applied.

Recorded data sent from an interface 107 connected to a computer is encoded to 8/9 codes (8-bit recorded data are converted to 9-bit recorded codes) by a coder 91 and thereafter, amplified by a write amplifier 92 and recorded in a magnetic recording medium 94 by a write head 93. Recorded signals on the recording medium are reproduced by an MR read head 95.

The reproduced signal is amplified by a preamplifier 103, the amplitude of the signal is adjusted by a variable-gain reproducing amplifier 96, and disturbing high-frequency noises in the signal are cut off by a low-pass filter 97, and thereafter the signal is input to a digital-block processing circuit 108. The reproduced signal input to the digital-block processing circuit 108 is quantized by an A-D converter 98 and the digital signal output from the A-D converter 98 is waveform-equalized to a class-4 partial response characteristic by a waveform equalizer 99 for amplitude asymmetry correction and a "1+D" processing circuit 100, and thereafter code-detected by a maximum likelihood detector (Viterbi detector) 101. In the case of the example shown here, the equalization function is shared by the waveform equalizer 99 and the "1+D" processing circuit 100. However, it is also possible to omit the "1+D" processing circuit 100 and perform waveform equalization required by the Viterbi detector 101 by means of only the waveform equalizer 99.

The output of the Viterbi detector 101 is decoded by a decoder 102 conforming to the coding rule of the coder 91 and then output to the interface 107 connected to a computer. Numeral 104 denotes a PLL/AGC for generating a clock signal of a digital block supplied to the A-D converter 98 and other circuits and the gain control signal of the read amplifier 96 in accordance with the equalizer output signal output from the "1+D" processing circuit 100.

First Embodiment

Figure 1:
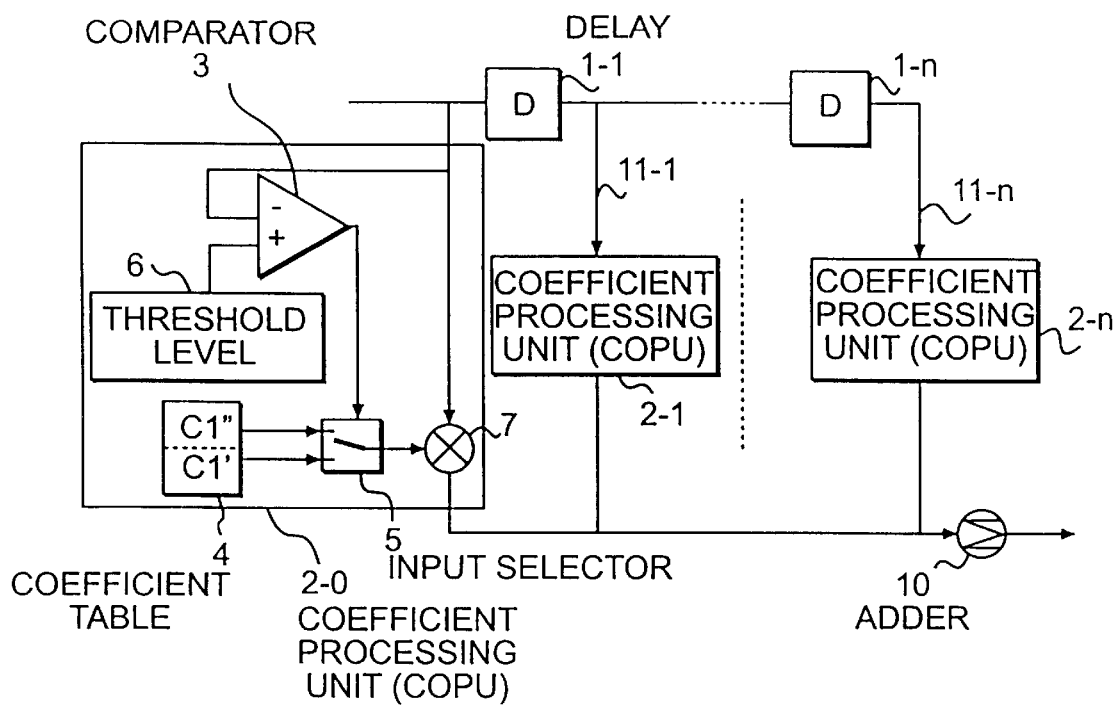
FIG. 1 is an illustration showing a first embodiment of an equalizer of the present invention.
Figure 2:
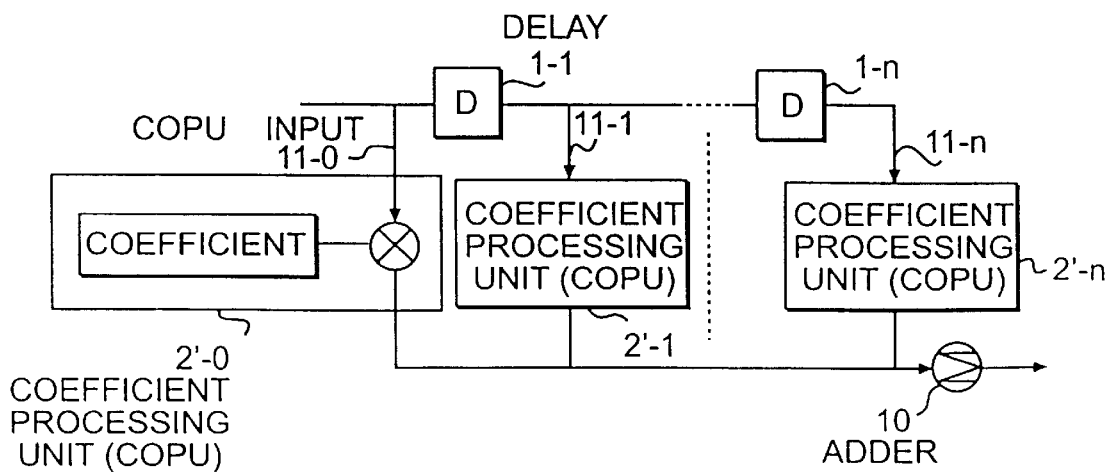
FIG. 2 is an illustration showing the structure of a conventional FIR-type equalizer.

FIG. 1 shows the first embodiment of the waveform equalizer 99 for amplitude asymmetry correction.

The waveform equalizer 99 comprises a plurality of delay elements 1 (1-1 to 1-n) having a delay time equivalent to one sample (one bit) corresponding to the bit interval between recorded codes, a plurality of coefficient processing units 2 (2-0 to 2-n) provided for the respective output taps of the delay elements and the input tap of the first-stage delay element, and the adder 10 for adding the outputs of the coefficient processing units.

Each coefficient processing unit 2-i comprises a threshold level table 6, a comparator 3 for comparing the value of an input signal 11-i from the tap with a threshold level supplied from the threshold level table 6, at least two coefficient tables 4 for generating coefficient values different from each other, an input (coefficient) selector 5 for changing the coefficient value in accordance with the output (comparison result) of the comparator 3, and a multiplier 7 for multiplying the input signal from the tap by a coefficient value selected by the selector and outputting the multiplication result. The signals output from the coefficient processing units are added by the adder 10 and the addition result is supplied to the succeeding stage circuit as the output signal of the equalizer. Moreover, a coefficient value suitable for amplitude asymmetry correction of the reproduced waveform is determined for each coefficient table 4.

Second Embodiment

Figure 4:
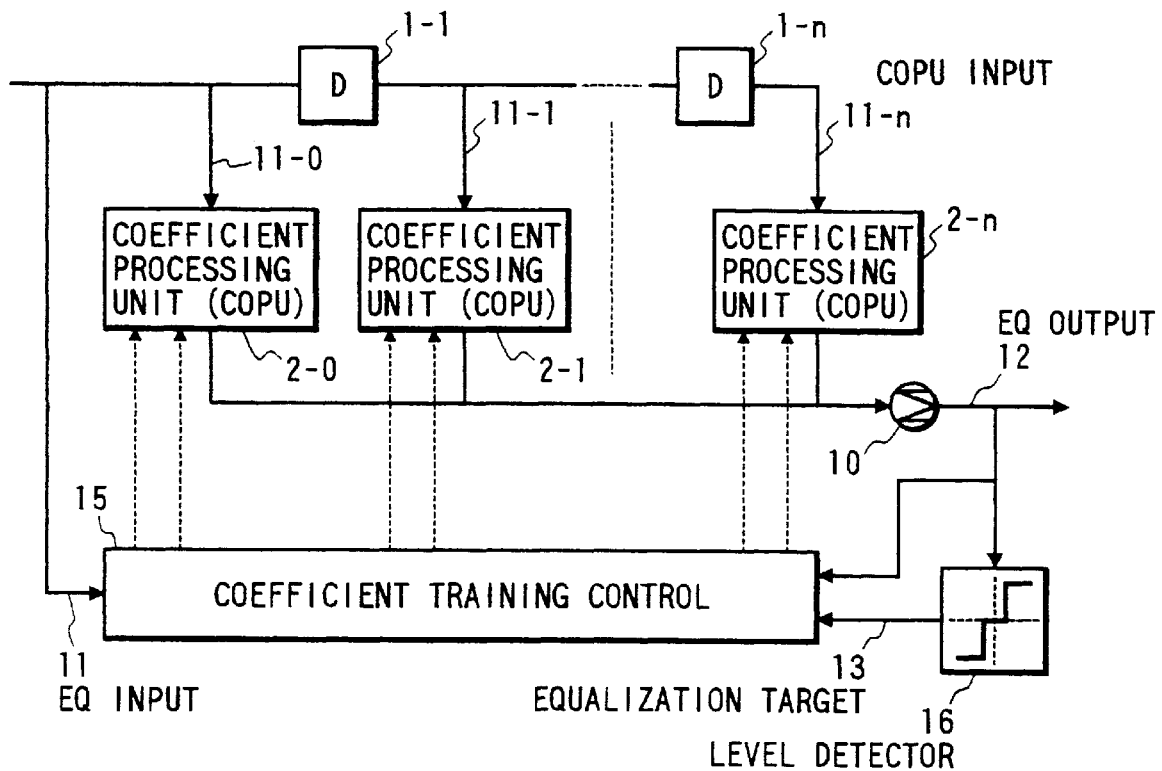
FIG. 4 is an illustration showing a second embodiment of an equalizer of the present invention.

FIG. 4 shows the second embodiment of the waveform equalizer 99 for amplitude asymmetry correction.

This embodiment has a structure in which a coefficient training control 15 for optimizing the coefficient value is provided for the equalizer (filter) 99 shown in FIG. 1.

The coefficient training control 15 calculates the coefficient value for obtaining the minimum equalization error based on the equalizer input and output 11 and 12 and an equalization target 13, and supplies the coefficient value to each coefficient processing unit 2. The result of detection of the equalizer output 12 by a level detector 16 is used as the equalizer target. When the tap coefficient previously set to each coefficient processing unit is a value approximate to the optimum value to a some extent, the erroneous detection frequency due to the level detection is low and the erroneous detection does not affect the coefficient training adversely.

Figure 5:
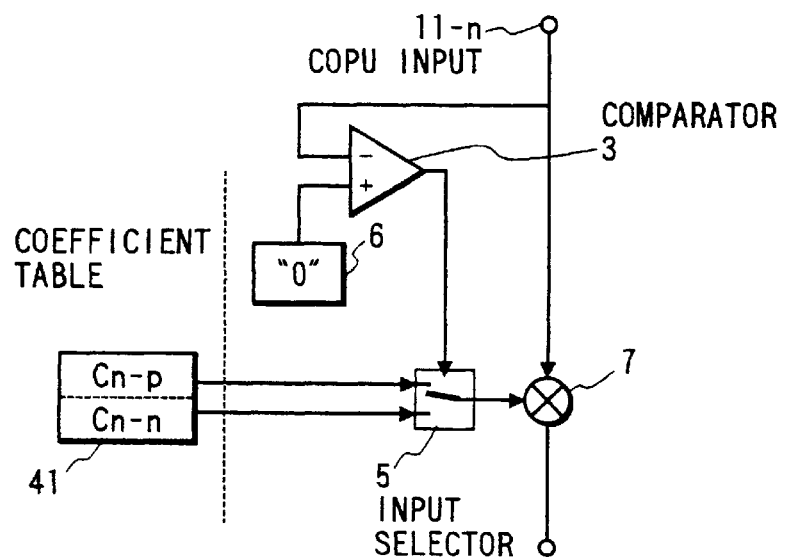
FIG. 5 is a block diagram showing the detail of a coefficient processing unit 2 of the embodiment of FIG. 4.

FIG. 5 shows the structure of the coefficient processing unit 2-n of the above embodiment. The other coefficient processing units 2-0 to 2-(n-1) have the same structure.

In this case, a value 0 is generated by the threshold level table 6 and the polarity of the coefficient processing unit input 11-n is detected by the comparator 3. The selector "25" is controlled in accordance with the detection result to change the coefficient. A coefficient generator comprises a coefficient table 41 in the coefficient training control 15.

FIG. 6 shows the structure of the coefficient training control.

A coefficient update section 40 updates coefficient values C1 to Cn for the coefficient processing units in the coefficient table 41 one by one in accordance with the equalization target value 13 corresponding to the equalizer input 11 and the output value 12 of the equalizer so as to minimize the equalization error. Each coefficient value in the coefficient table 41 and a value determined by multiplying the coefficient value by an amplitude asymmetry correction coefficient "as" are supplied to the corresponding coefficient processing unit 2 of the equalizer 99 as a coefficient value conforming to the polarity of an input signal.

Third Embodiment

The embodiment shown in FIG. 7 is obtained by improving the AD converter 98 and the amplitude asymmetry correction equalizer 99 of FIG. 3 in order to operate the embodiment by high-speed clocks.

In FIG. 7, a signal sampled by an AD converter (ADC) 98' is separated into a sampling signal (ODD sample) 55 sampled by odd clocks (ODD Clock) and a sampling signal (EVEN sample) 56 sampled by even clocks (EVEN Clock) and input to an equalizer 99'. The equalizer 99' performs equalization by means of equalizer blocks of two systems having the same characteristics and outputs an odd-clock equalization output and an even-clock equalization output. An arithmetic circuit 100' performs "1+D" operation of these outputs and a Viterbi detector 100' judges the recorded codes.

Figure 8:
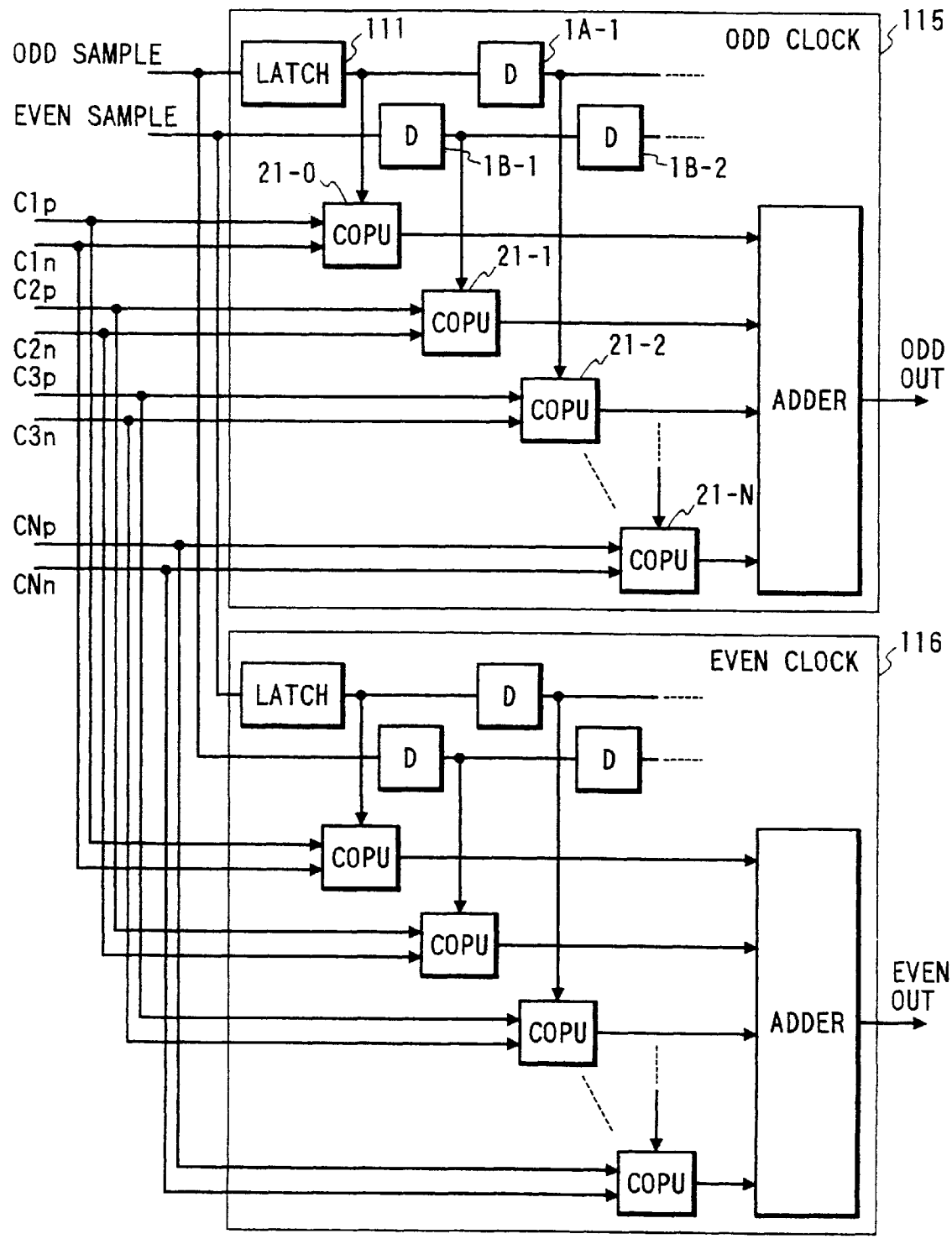
FIG. 8 is a block diagram showing the detail of an equalizer 99' of the embodiment of FIG. 7.

FIG. 8 shows the structure of the equalizer 99' which comprises an ODD equalizer block 115 and an EVEN equalizer block 116. These equalizer blocks have the same structure except that the inverted relation between the sampling signals 55 and 56 of the input signals and use different operation clocks.

Each equalizer block comprises a latch 111 for capturing the first sampling input at the clock timing, delay elements 1A-, 1A-2, . . . for successively delaying the latch output, delay elements 1B-1, 1B-2, . . . for successively delaying the second sampling input, coefficient processing units 21 (21-0 to 21-N), and the adder 10 for adding the outputs of the coefficient processing units. Each coefficient processing unit 21 corrects the amplitude asymmetry of the input signal by selecting one of the two coefficient values Cip and Cin (i=l to N) in accordance with the polarity of the input signal similarly to the case of the second embodiment.

Fourth Embodiment

The above-mentioned first to third embodiments detect the value or polarity of the input signal by each coefficient processing unit, determines the coefficient in accordance with the detection result, and perform multiplication of the decided coefficient value and the input signal value. Therefore, the multiplication cannot be performed until the detection of input values is completed and thus, a lot of time is required by the end of the operation.

Figure 9:
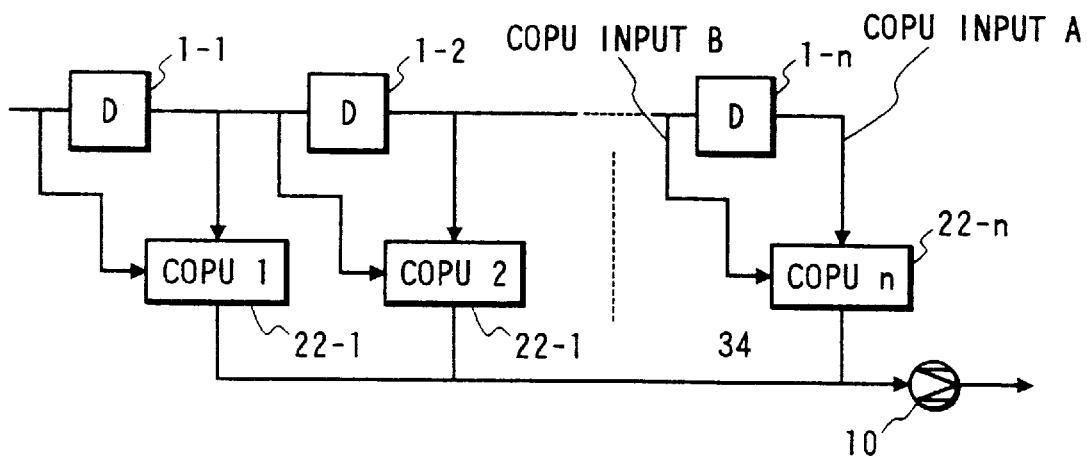
FIG. 9 is an illustration showing a fourth embodiment of an equalizer of the present invention.

As shown in FIG. 9, in this embodiment the signal output from the preceeding-stage tap to the comparator of each of the coefficient processing units 22 (22-1 to 22-n) and detects the value or polarity of the input signal by using the signal one clock before the signal to be multiplied.

Figure 10:
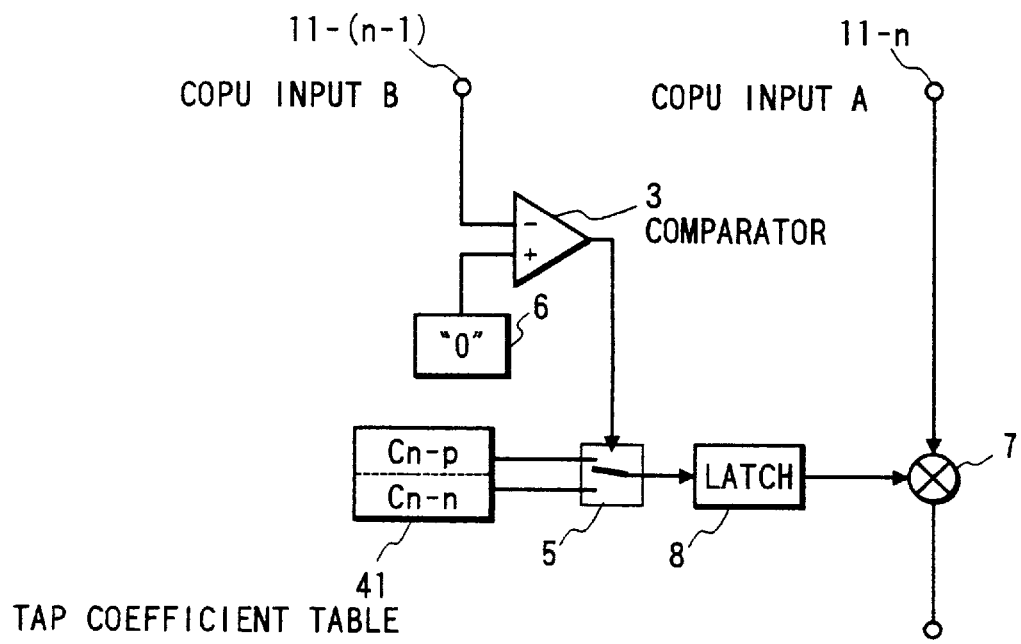
FIG. 10 is a block diagram showing the detail of a coefficient processing unit 22 of the embodiment of FIG. 9.
Figure 11:
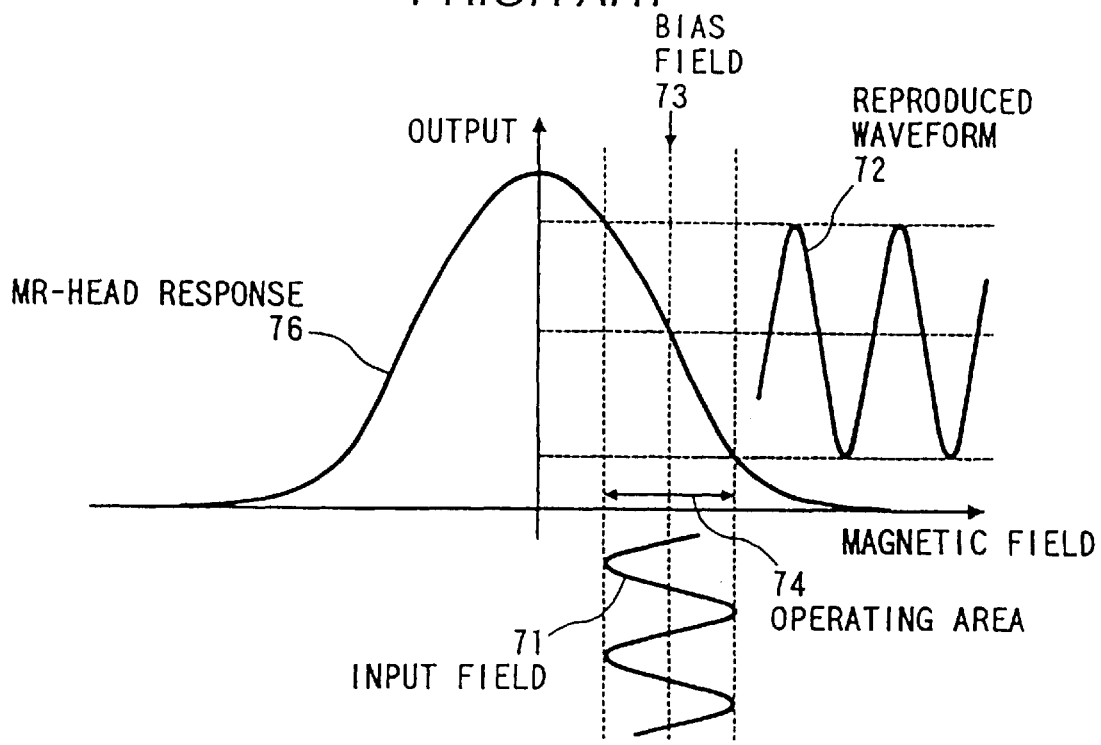
FIG. 11 is an illustration for explaining the principle of the conversion of magnetic field to reproduced voltage by an MR head.

FIG. 10 shows the structure of the coefficient processing unit 22-n.

The comparator 22 detects the polarity of the output signal 11-(n-1) of the preceeding-stage tap, selects one of two coefficients Cn-p and Cn-n in accordance with the detection result, and stores the selected one in the latch 8 as a new coefficient value. At the timing when the output signal 11-n of the tap to be operated is input to the multiplier 7, multiplication is performed by using a coefficient value already set in the latch 8 and the multiplication result is output to the adder 10.

According to the above structure, the tap output to be multiplied is supplied to the multiplier 7 after the coefficient value corresponding to the tap output to be multiplied is set in the latch 8. Therefore, multiplication can be started without waiting the polarity detection and hence a high-speed operation is realized. Moreover, the above structure can also be applied to the structure of the parallel equalizer of the third embodiment.

In the above embodiments, a decoding circuit according to the Partial Response Maximum Likelihood(PRML) signal processing method has been described. However, an equalizer of the present invention can also be applied to signal processing according to another system such as the EPRML (Extended PRML) system.

Figure 12:
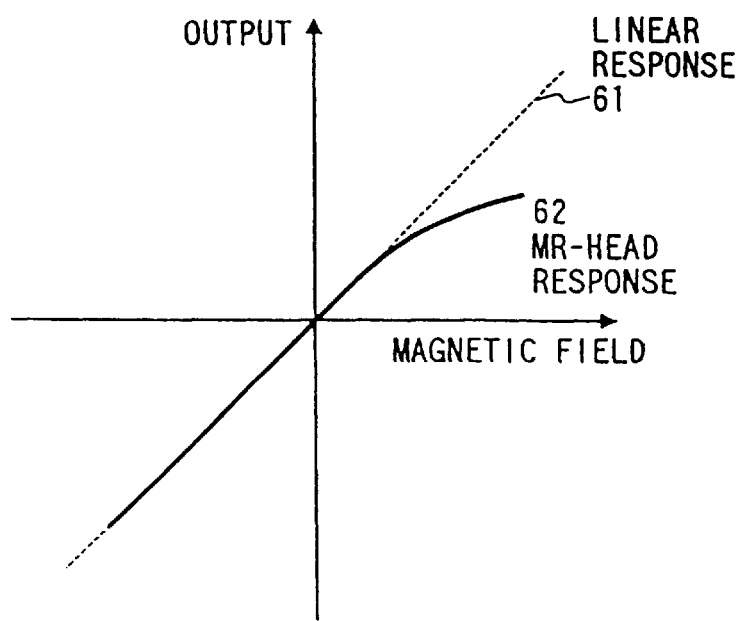
FIG. 12 is an illustration showing the characteristics of conversion of magnetic field to reproduced voltage of an MR head.
Figure 13:
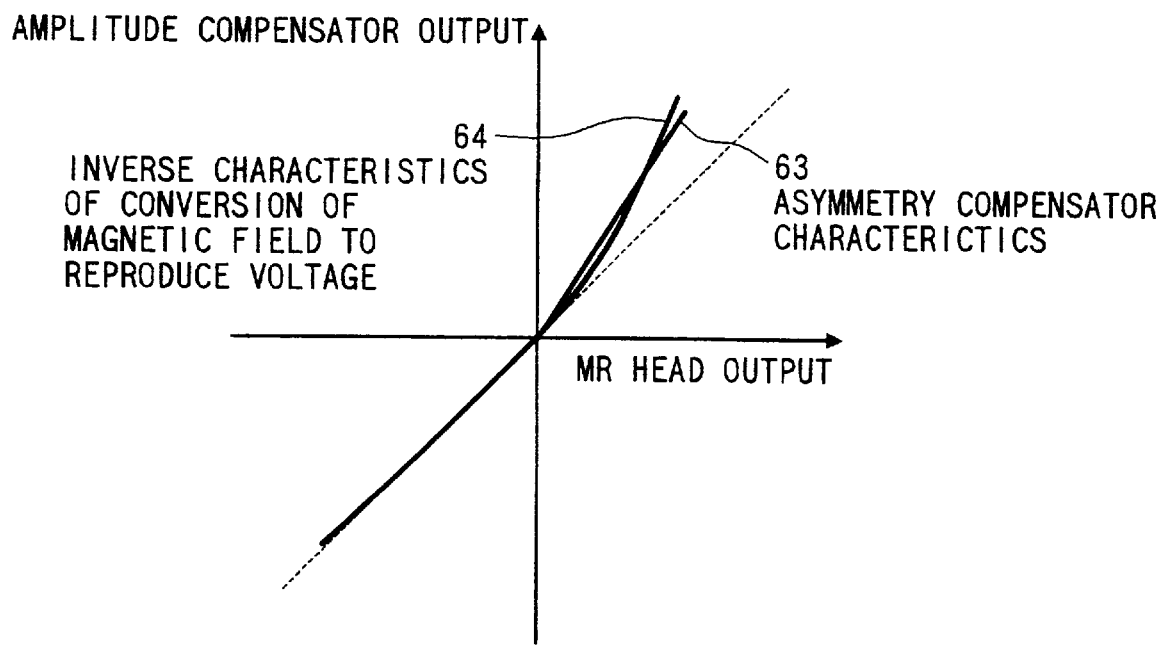
FIG. 13 is an illustration showing the characteristics of an amplitude asymmetry compensation circuit.

When the magnetic field-to-reproduced voltage conversion characteristic of an MR head is represented by a curve (non-linear characteristic) deviated from the ideal linear conversion characteristic 61 shown by the solid line 62 of FIG. 12, the inverse characteristic of conversion of magnetic field to reproduced voltage shown by the curve 64 of FIG. 13 is ideally required to correct the non-linear characteristic 62. In an actual application, non-linearity is corrected by an asymmetry compensator characteristic 63 obtained by approximating the inverse characteristic 64 by a conversion characteristic represented by a polygonal line.

Figure 14A:
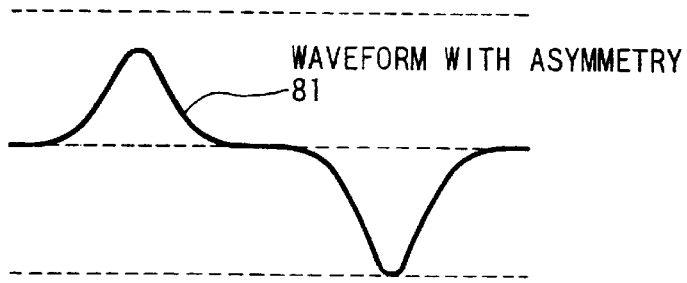
FIGS. 14(A) to 14(D) are signal waveform diagrams for explaining advantages of the present invention.
Figure 14B:
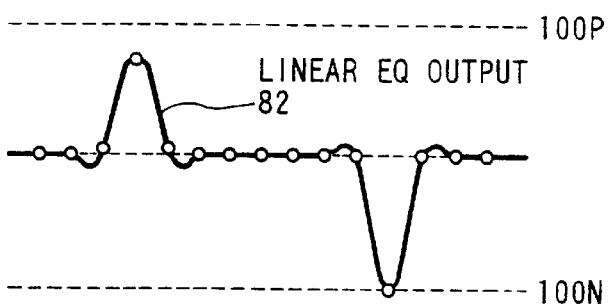
Figure 14C:
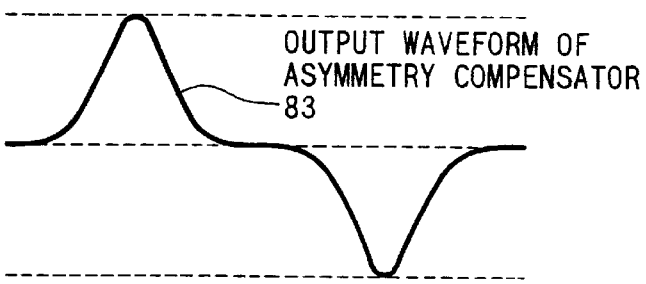
Figure 14D:
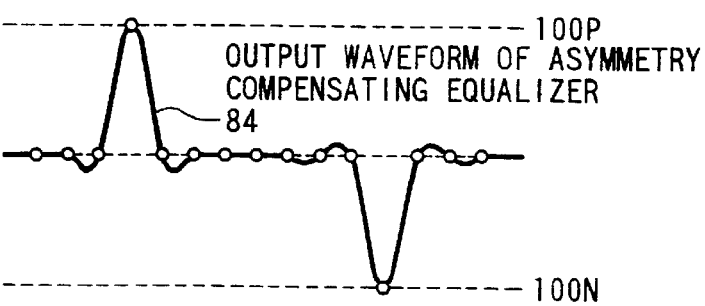

If, for example, a reproduced signal having a waveform 81 with asymmetry reproduced by an MR-type read head is inputted as shown in FIG. 14(A) and equalized by an FIR-type equalizer having no amplitude asymmetry correcting function, a linear EQ output 82 is obtained as shown in FIG. 14(B) and deviated from the equalization target level shown by the broken line 100P. However, by adding the amplitude asymmetry correcting function obtained from the structure of the present invention, the waveform inputted to the equalizer is corrected to a signal waveform almost vertically symmetric as shown by the waveform 83 of FIG. 14(C). When the signal thus corrected is equalized by an FIR filter, positive and negative distortions are removed from the equalizer output as shown by a waveform 84 of FIG. 14(D) and therefore, the deviations from the equalization targets 100P and 100N can be eliminated. Moreover, as shown in the embodiments, when providing the amplitude asymmetry correcting function in an equalizer, it is possible to minimize the increase of the circuit delay and decrease the influence on the control loops such as the PLL/AGC.

As described above, the present invention makes it possible to correct the reproduced-waveform distortion due to the non-linear characteristic of an MR head by adopting a relatively simple circuit structure. Therefore, by combining the present invention with any one of existing various signal processing systems, advantages of an MR head can effectively be used and thereby, a reliable digital recorded-signal reproducer and magnetic disk drive can be obtained.

What is claimed is:

1. A magnetically recorded-signal reproducer comprising a read head using an MR element for reading the code signal recorded on a recording medium, amplification means for amplifying reproduced signals output from said read head, means for sampling the signal output from said amplification means at a predetermined cycle, means for equalizing the signal output from said sampling means in accordance with a predetermined equalization rule, and means for judging the recorded codes read by said read head;

wherein said equalization means is provided with means for correcting the signal distortion inherent to said read head and included in the signal output from said sampling means;

wherein said equalization means includes a plurality of multistage-connected delay elements for delaying signals output from said sampling means, a plurality of coefficient processing units each connected to the output tap of one of said delay elements or the input tap of the first-stage delay element to multiply a signal input from the connected tap by a predetermined coefficient value and output the multiplication result, and an adder for adding the signal outputs from coefficient processing units; and wherein said signal distortion correction means includes coefficient selection means for selecting a coefficient value from a plurality of predetermined coefficient values in accordance with the signal that is input every time the signal is supplied to each of said coefficient processing units, wherein each of said coefficient processing units has a plurality of predetermined coefficient values.

2. A magnetically recorded-signal reproducer according to claim 1, wherein said equalization means includes a plurality of multistage-connected delay elements for delaying signals output from said sampling means by a period equal to a bit interval between recorded codes at a time.

3. The magnetically recorded-signal reproducer according to claim 2, wherein said correction means corrects the amplitude distortion which differs depending on the polarity of the signal output from said sampling means.

4. The magnetically recorded-signal reproducer according to claim 3, further comprising filter means for supplying a signal component in a predetermined frequency range of the signal outputted from said amplification means to said sampling means.

5. The magnetically recorded-signal reproducer according to claim 2, further comprising filter means for supplying a signal component in a predetermined frequency range of the signal outputted from said amplification means to said sampling means.

6. The magnetically recorded-signal reproducer according to claim 1, wherein said correction means corrects the amplitude distortion which differs depending on the polarity of the signal output from said sampling means.

7. The magnetically recorded-signal reproducer according to claim 6, further comprising filter means for supplying a signal component in a predetermined frequency range of the signal outputted from said amplification means to said sampling means.

8. The magnetically recorded-signal reproducer according to claim 1 further comprising filter means for supplying a signal component in a predetermined frequency range of the signal outputted from said amplification means to said sampling means.

* * * * *